(12) United States Patent
Fahringer et al.

(10) Patent No.: US 11,258,394 B2
(45) Date of Patent: Feb. 22, 2022

(54) METHOD FOR DETECTION OF UPCOMING POLE SLIP

(71) Applicant: INNIO Jenbacher GmbH & Co OG, Jenbach Osterreich (AT)

(72) Inventors: Albert Fahringer, Kossen Osterreich (AT); Erich Kruckenhauser, Munster Osterreich (AT)

(73) Assignee: INNIO Jenbacher GmbH & Co OG, Jenbach Osterreich (AT)

( * ) Notice: Subject to any disclaimer, the term of this patent is extended or adjusted under 35 U.S.C. 154(b) by 817 days.

(21) Appl. No.: 15/567,175

(22) PCT Filed: Apr. 11, 2016

(86) PCT No.: PCT/AT2016/000036
§ 371 (c)(1),
(2) Date: Oct. 17, 2017

(87) PCT Pub. No.: WO2016/164944
PCT Pub. Date: Oct. 20, 2016

(65) Prior Publication Data
US 2018/0102725 A1    Apr. 12, 2018

(30) Foreign Application Priority Data
Apr. 17, 2015   (AT) .................................. A 233/2015

(51) Int. Cl.
*H02K 19/36* (2006.01)
*H02P 29/024* (2016.01)
(Continued)

(52) U.S. Cl.
CPC .......... *H02P 29/024* (2013.01); *G01R 31/343* (2013.01); *H02K 19/36* (2013.01);
(Continued)

(58) Field of Classification Search
CPC .... H02P 29/024; H02P 29/0241; H02P 9/009; H02P 9/02; H02P 2101/15; H02P 9/006;
(Continued)

(56) References Cited

U.S. PATENT DOCUMENTS 9,382,855 B2   7/2016   Fahringer et al.
9,594,091 B2   3/2017   Niedrist
(Continued)

FOREIGN PATENT DOCUMENTS

AT   514007 A1   9/2014
AT   514024 A1   9/2014
(Continued)

OTHER PUBLICATIONS

Redfern et al. "A study into a new solution for the problems experienced with pole slipping protection", (Apr. 1998), IEEE.*
(Continued)

*Primary Examiner* — Eyob Hagos
(74) *Attorney, Agent, or Firm* — Fletcher Yoder, P.C.

(57) ABSTRACT

A method for detecting an imminent pole slip of a synchronous generator electrically connected to a power supply network, whereby a signal characteristic of a power fault is detected and an imminent pole slip is determined via a predefinable value when a load angle of the synchronous generator increases, whereby the following steps are performed. Determination of a first load angle during operation without a power fault, determination of a generator frequency as a function of time when a power fault occurs, and precalculation of a second value of a load angle resulting from the power fault by adding the first value of the load angle to a load angle difference occurring during the power fault, whereby this load angle difference is caused by a deviation of a generator frequency relative to a power frequency.

14 Claims, 5 Drawing Sheets

(51) Int. Cl.
  *H02P 9/02* (2006.01)
  *G01R 31/34* (2020.01)
  *H02P 9/00* (2006.01)
  *H02P 101/15* (2016.01)

(52) U.S. Cl.
  CPC ............... *H02P 9/009* (2013.01); *H02P 9/02* (2013.01); *H02P 29/0241* (2016.02); *H02P 2101/15* (2015.01)

(58) Field of Classification Search
  CPC ... H02P 2101/25; G01R 31/343; H02K 19/36; H02H 7/06
  See application file for complete search history.

(56) References Cited

U.S. PATENT DOCUMENTS

| | | | | |
|---|---|---|---|---|
| 2004/0008010 A1* | 1/2004 | Ebrahim | ................... | H02P 9/30 322/44 |
| 2010/0039077 A1* | 2/2010 | Dalby | .................... | H02P 9/009 322/59 |
| 2012/0292921 A1* | 11/2012 | Fahringer | ........... | F02D 41/0205 290/40 B |
| 2013/0168960 A1* | 7/2013 | Kalinka | ................. | H02P 9/006 290/7 |
| 2013/0176648 A1* | 7/2013 | De Kock | ................ | H02P 9/009 361/23 |
| 2013/0231783 A1* | 9/2013 | Krata | ........................ | H02P 9/10 700/275 |
| 2013/0257049 A1* | 10/2013 | Taylor | .................... | F03D 9/255 290/43 |
| 2016/0187425 A1 | 6/2016 | Fahringer | | |

FOREIGN PATENT DOCUMENTS

| | | |
|---|---|---|
| DE | 2823201 A1 | 11/1979 |
| DE | 102010001248 A1 | 7/2011 |
| WO | 2011088483 A1 | 7/2011 |

OTHER PUBLICATIONS

Unofficial English Translation of AT Search Report issued in connection with corresponding AT Application No. A233/2015 dated Mar. 10, 2016.

Unofficial English Translation of AT Office Action issued in connection with corresponding AT Application No. A233/2015 dated May 3, 2016.

PCT International Search Report and Written Opinion; Application No. PCT/AT2016/000036; dated Jul. 22, 2016; 5 pages.

Sanaye-Pasand, Majid, et al.; "Study, Comparison and Simulation of Power System Swing Detection and Prediction Methods", 2003 IEEE, Power Engineering Society General Meeting, Conference Proceedings,Jul. 13-17, 2003, vol. 1, pp. 27-32, XP010687218.

Binder, Andreas; "Elektrische Maschinen und Antriebe: Grundlagen, Betriebsverhalten", Dec. 9, 2012, Springer-Verlag, XP002759661, pp. 584-585.

* cited by examiner

METHOD FOR DETECTION OF UPCOMING POLE SLIP

BACKGROUND

The invention relates to a method for detecting an imminent pole slip of a synchronous generator electrically connected to a power supply network. In addition, the invention relates to a device for detecting an imminent pole slip.

The polar wheel angle, also known as the load angle, is the angle at which the rotor of a synchronous machine, also referred to as a polar wheel, moves ahead of the synchronous rotary field (generator operation) or lags behind it (motor operation). The relationship between the load angle and the polar wheel angle exists over the number of pole pairs of the synchronous machine, whereby the load angle results from the multiplication of the polar wheel angle by the number of pole pairs of the synchronous machine (e.g. a synchronous generator).

The load angle is a measure of the stability of the synchronous generator operation. In a synchronous generator connected to a power supply network, the load angle expresses the deviation of the magnetic poles on the rotor of the synchronous generator from the magnetic poles on the stator of the synchronous generator. The magnetic poles on the rotor are usually produced by a DC-fed exciter winding on the rotor. The magnetic poles on the stator of the synchronous generator are generated by the electrical voltage of the power supply network applied to the DC winding on the stator, which is typically designed with three phases.

The load angle describes the angle between the stator voltage and the rotor voltage or polar wheel voltage in the pointer model, whereby the polar wheel voltage moves ahead in the synchronous generator operation of the stator voltage. This load angle increases as the load on the power supply network increases, i.e. when the synchronous generator receives an increased energy supply. If the load angle becomes too large, this leads to instability of the synchronous generator. Generally, the load angles in generator operation are 20° to 30° at nominal power. If the load angle becomes too large, this leads to instability of the generator. This tipping into the unstable operating state is known as a pole slip. Pole slip can lead to damage to the generator and/or its associated power elements. It is therefore important to know the load angle when operating synchronous generators.

Numerous methods for determining a load angle are known from the prior art.

DE 10 2010 001248 A1, for example, discloses how to determine the load angle from the detected time between the occurrence of a rotary speed signal from the rotor of the synchronous generator and the occurrence of a voltage zero crossing of a voltage signal from the power supply network.

AT 514007 A1 of the applicant discloses a method for determining a load angle of a synchronous generator electrically connected to a power supply network, whereby the load angle is determined from a period of time between a report of a rotary speed signal and a report of the frequency signal.

AT 514024 A1 shows a method for detecting pole slip, whereby the mechanical rotary frequency of the motor shaft and an electrical rotary frequency of the power supply network are detected or determined, whereby a signal is output in the case of a deviation of the mechanical rotary frequency from the electrical rotary frequency that is larger than a predefinable threshold value, whereby the signal is regarded as a detected pole slip. This method is based on the fact that, when a pole slip occurs, the drive unit revs up from its substantially constant rotary speed during the stable stationary operating mode.

With the methods known from the prior art, however, it is not possible to determine the load angle in the event of a power fault in the power supply network, because the methods access variables which cannot be used to determine the load angle when a power fault occurs.

The methods are also not suitable for detecting an imminent pole slip, but rather can only detect the occurrence of such a pole slip.

US 2013168960 A1 describes a method for detecting the occurrence of a pole slip when a synchronous generator is used and for disconnecting such a generator from the power supply if a pole slip occurs. It discusses in more detail how a load angle is calculated with the aid of the rotor frequency and the starter frequency.

BRIEF DESCRIPTION OF THE INVENTION

It is therefore an object of the invention to provide a method for detecting an imminent pole slip. In particular, the detection of an imminent pole slip should be made possible in the event of a power fault in the power supply network. The occurrence of a pole slip should be prevented.

This object is achieved by the features of patent claim 1 or the features of patent claim 7. Embodiments of the invention are defined in the dependent claims.

It is therefore provided that the method for determining a load angle of a synchronous generator electrically connected to a power supply network in the event of a power fault in the power supply network consists of the following steps: Determination of a first value of a generator load angle during operation without a power fault, Determination of a generator frequency as a function of time when a power fault occurs, and Precalculation of a second value of a load angle resulting from the power fault by adding the first value of the load angle to a load angle difference occurring during the power fault, whereby this load angle difference is caused by a deviation of a generator frequency relative to a power frequency.

The load angle is thus determined during operation without a power fault by means of known methods. In addition, a generator frequency is determined as a function of time in the event that a power fault occurs. While the generator frequency essentially corresponds to the power frequency in operation without a power fault, deviations of the generator frequency from the power frequency occur during a power fault. The load angle resulting from the power fault is then calculated by adding the first value of the load angle (the load angle that existed in the operation without a power fault before the occurrence of the power fault) to a load angle difference g occurring during the power fault, whereby this load angle difference is the result of the deviation of a generator frequency relative to a power frequency. This calculation is performed continuously. The basic idea of an embodiment explained once again hereinbelow:

Power faults are caused, for example, by a short-circuit on the network side. In such a case, the generator voltage falls to zero and the generator can no longer provide any power to the power supply network. This leads to the acceleration of the synchronous generator in the direction of an asynchronicity, which can lead to the destruction of the synchronous generator. A power fault thus increases the load angle until, in the worst case, a pole slip occurs. In the case of a pole slip, very large currents occur in the generator windings, which can destroy the generator.

However, the power frequency of the power supply network remains substantially constant even when a power fault occurs. According to an embodiment of the invention, the angular offset that occurs between the changing generator frequency and the power frequency is then determined, and this load angle difference is added to the first value of the load angle from the operation without a power fault before the occurrence of the power fault. This determines the load angle resulting from the power fault.

The load angle in operation without a power fault—also called the network-valid load angle—is detected, for example, continuously by storing the current value of the load angle. This can be performed, for example, by a memory in which the values for the load angle of the last elapsed 500 ms (milliseconds) are averaged.

As soon as a power fault is detected, the measurement of the network-valid load angle is interrupted and the last valid value is stored and no longer overwritten.

This value then serves as the value of the load angle, to which the above-described load angle difference is added to calculate the load angle resulting from the power fault. The load angle difference is, for example, determined such that an integral from the motor frequency (=generator frequency) is formed from a rotary speed measurement of the generator. The result of this integral forms the load angle difference, which is added to the final value of the network-valid load angle to calculate the load angle resulting from the power fault.

It is provided that, after detecting a signal characteristic of a power fault, a load angle difference is determined between the polar wheel voltage and the generator voltage, which (load angle difference) is caused by a deviation of a generator frequency relative to a power frequency. The polar wheel voltage and the generator voltage are considered to be vector variables so that the load angle difference is obtained between the vectors.

In the present case of an operation in parallel with a network, the power supply voltage is equal to the generator voltage.

It is provided that the load angle in operation without a power fault is calculated by measuring a generator voltage and a generator current. The load angle in operation without a power fault is also referred to as the static load angle.

The calculation of the load angle $\vartheta$ in operation without a power fault from a generator voltage and generator current then results from the formula $$\tan \vartheta = (I_O * Xq * \cos \varphi)/(U_O + I_O * Xq * \sin \varphi)$$

where $U_O$=generator operating voltage at Ph-N, $I_O$= generator operating current, $Xq=Xq_{Gen}*U_{Nominal}/I_{Nominal}$ where $Xq_{Gen}$=reactance from generator data sheet, $U_{Nominal}$= generator nominal voltage Ph-N, $I_{Nominal}$=generator nominal (phase) current.

To determine the generator frequency, it is in particular possible to perform measurements via a motor pickup, i.e. a measurement of the motor speed, or via the generator current, i.e. via an electrical variable of the generator. The determination of the generator frequency via the observation of the zero crossings of the generator current is particularly advantageous, in an embodiment, compared to the determination of the generator frequency from an observation of zero crossings of the generator voltage, since in the event of a short-circuit in the network, this voltage can be zero.

It can be provided that at least one measure for reducing the load angle is taken when a first predefinable value for the load angle resulting from the power fault is exceeded. This aspect comes into effect when the synchronous generator is part of a power generation system. If, for example, the synchronous generator is arranged with an internal combustion engine to form a genset, the load angle can be limited by intervening in the internal combustion engine (e.g. throttling of the fuel supply) or by means of a mechanical brake.

It is provided that, from the calculated value of a load angle resulting from the power fault, a decision is derived as to whether the synchronous generator should remain connected to the power supply network.

Thus, it can be provided that, when a second predefinable value is exceeded, the synchronous generator is disconnected from the power supply network for the load angle resulting from the power fault. This aspect shows a substantial advantage of the proposed method, since the effects of the power fault on the load angle can be detected, thus creating the basis for a decision as to whether the synchronous generator should be disconnected from the power supply network to prevent damage. For this purpose, for example, a maximum permissible value of the load angle can be stored, and if this value is exceeded, then the synchronous generator is disconnected from the power supply network.

Protection is also sought for a device for determining a load angle according to claim 8.

It is provided that the device further consists of a mechanical power source that is mechanically coupled to the synchronous generator. It can be provided that the mechanical power source is an internal combustion engine, even more particularly a stationary engine (e.g. gas engine, diesel engine, gasoline engine or dual-fuel engine). It can also be provided that the mechanical power source is a wind power plant, a hydroelectric power plant or a gas turbine.

BRIEF DESCRIPTION OF THE DRAWINGS

The invention is explained in more detail with reference to the figures. The figures show the following.

DETAILED DESCRIPTION

Figure 1:
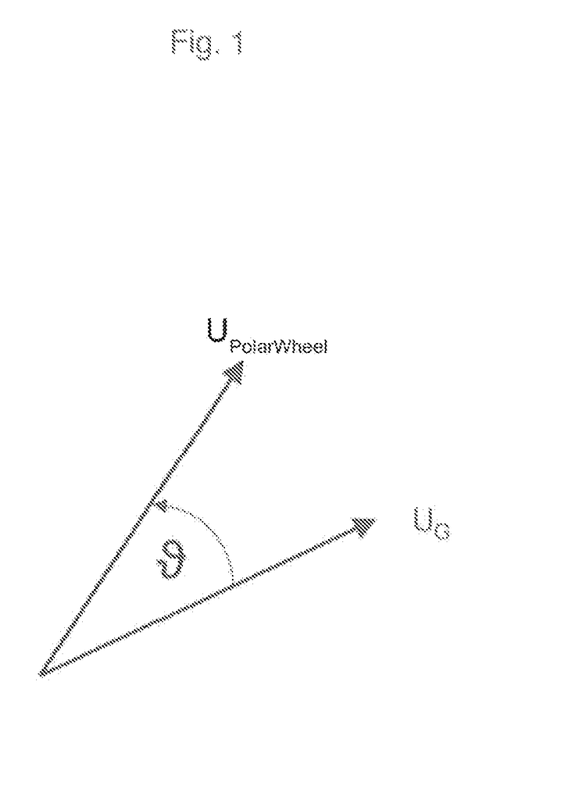
FIG. 1 a representation of the load angle in the pointer model.

FIG. 1 shows a representation of the load angle in the pointer model of a synchronous generator. The load angle $\vartheta$ has a span between the polar wheel voltage $U_{Polarwheel}$ and the generator voltage $U_G$. The arrow at the load angle indicates the rotation direction. In the present case of an operation in parallel with a network, the generator voltage is equal to the power supply voltage. In generator operation of the synchronous generator, therefore, the polar wheel voltage $U_{Polarwheel}$ moves ahead of the generator voltage $U_G$ (i.e. also the power supply voltage). In normal generator operation, the load angle is generally between 20° and 30°. When a load angle of 180° is exceeded electrically, a pole slip occurs and the synchronous generator loses its synchronization with the power supply network.

Figure 2:
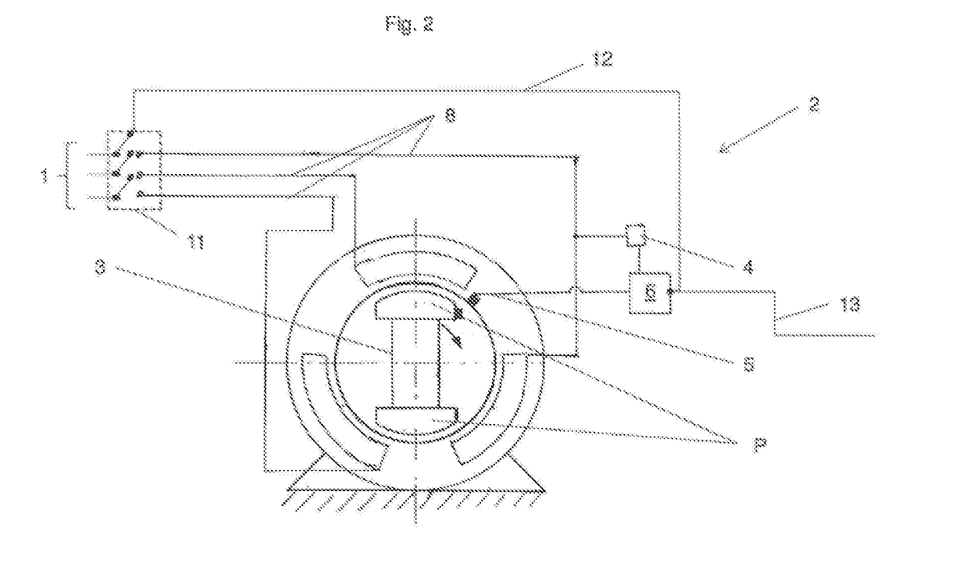
FIG. 2 a schematic representation of a synchronous generator.

FIG. 2 shows a schematic representation of a synchronous generator 2 whose rotor (polar wheel) has two poles P.

The phases 8 of the synchronous generator 2 are separably connected to a power supply network 1 through the evaluation unit 6 via a signal line 12 by means of a switching device 11. Via a further signal line 13, the evaluation unit 6 can perform interventions on a mechanical power source 7 (not shown). The evaluation unit 6 is designed in a control unit of the synchronous generator 2 and/or in a control unit of the mechanical power source 7.

In addition, a rotary speed measuring device 5 for determining the rotary speed of the rotor 3 is shown. The measuring device 4 is used to determine a frequency of a generator voltage $U_G$ and/or a generator current $I_G$ of the synchronous generator 2. In addition, an evaluation unit 6, to which the signals of the measuring device 4 and the rotary speed measuring device 5 can be reported, is shown.

Figure 3:
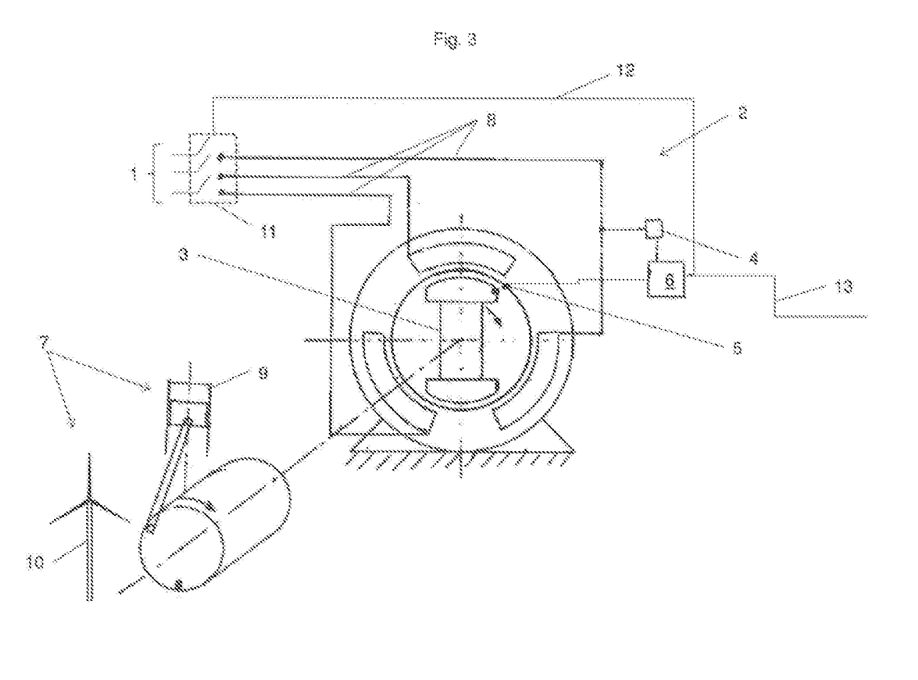
FIG. 3 a schematic representation of a synchronous generator connected to a mechanical power source, FIG. 4 a diagram of the rotary speed and load angle difference after the occurrence of a power fault as a function of time, and FIG. 5 a flow diagram of an exemplary embodiment.

FIG. 3 shows a further representation of a synchronous generator 2 which, in this representation, is connected to a mechanical power source 7 via the rotor 3. By way of example, the mechanical power source 7 is shown as an internal combustion engine 9 or a wind power plant 10.

Figure 4:
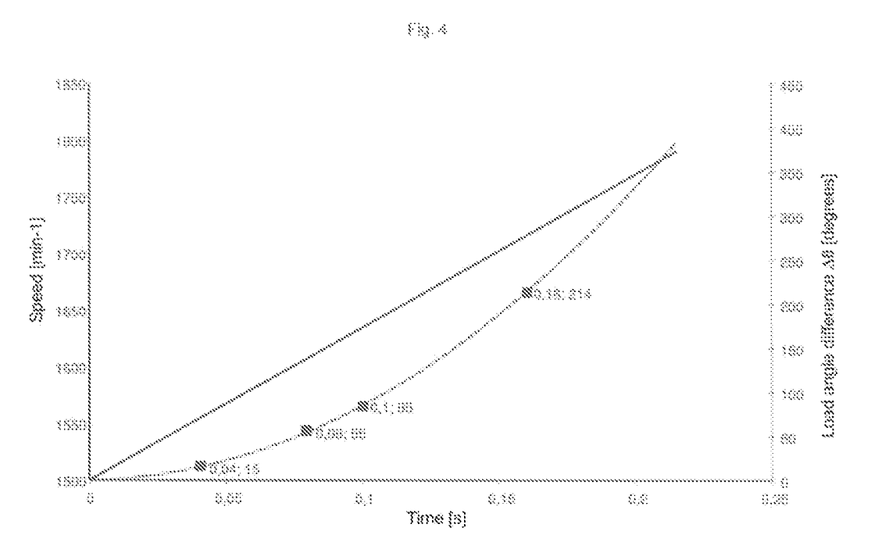

FIG. 4 shows a relationship of the rotary speed trend of a synchronous generator 2 with the load angle difference $\Delta\vartheta$ on the occurrence of a power fault in the power supply network 1. The solid line represents the rotary speed development of the synchronous generator 2 as a function of time plotted on the X-axis. The corresponding Y-axis of the rotary speed in revolutions per minute is shown on the left-hand Y-axis of the diagram. It can be seen that the rotary speed of the synchronous generator 2 increases, starting from the nominal rotary speed, by the elimination of the electrical load in the power supply network 1.

The dotted curve shows a load angle difference $\Delta\vartheta$ in degrees, which increases due to the acceleration of the synchronous generator 2 after a power fault in the power supply network. The load angle difference $\Delta\vartheta$ is understood to be the angle value that results from the deviation of the generator frequency $f_G$ relative to the power frequency $f_{grid}$. Since the power frequency $f_{grid}$ can be regarded as constant and given, the load angle difference is essentially caused by the change in the generator frequency $f_G$. The Y-axis-related load angle difference $\Delta\vartheta$ is the right-hand Y-axis of the diagram. The calculation of the load angle difference $\Delta\vartheta$ is illustrated by a numerical example: the generator speed prior to the power fault (starting speed) is 1500 rpm. Expressed as a frequency, this corresponds to a generator frequency $f_G$ of 25 Hz. At a time of 0.005 s (seconds) after the power fault, the speed has increased to 1,507 rpm. The speed difference divided by 60 times the time difference (0.005 s–0 s) times 360 times the number of pole pairs (the number of pole pairs is here 2) gives the current load angle difference at the time 0.005 s after the power fault, in this example 0.4 degrees. The calculation of the load angle difference is then continued by adding or integration, for example, until it exceeds a first predefinable value for the second load angle resulting from the power fault, $\vartheta_{fail}$, where $\vartheta_{fail}=\vartheta_{op}+\Delta\vartheta$.

The increase in a load angle above a predefinable value can be interpreted as an imminent pole slip.

Figure 5:
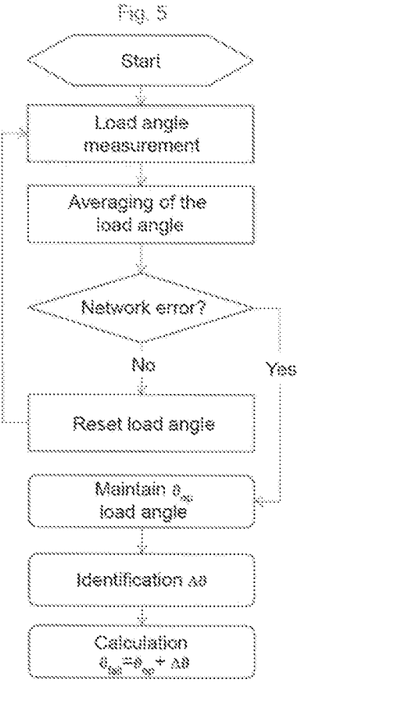

FIG. 5 shows a flow diagram of the inventive method according to an exemplary embodiment. The routine which can be stored in a control device starts with the "start" circuit diagram and can, for example, be repeated every 10 ms (milliseconds). In a first step ("load angle measurement"), the load angle is measured during operation without a power fault of the synchronous generator 2. The load angle can be determined in known manner, for example, via a frequency of a generator voltage $U_G$ and a generator current $I_G$ of the synchronous generator 2.

In the next step, "averaging the load angle", the load angle is averaged over the last 500 ms (milliseconds).

If a power fault does not occur, a new average value of the load angle is formed by the routine, into which the result of the last load angle measurement is fed. The average value of the load angle is thus continuously overwritten by this routine, such that the average value of the load angle always represents the average value of the load angle in the last 500 ms (milliseconds).

If a power fault occurs, the last determined average value of the load angle of the operation without a power fault is stored as the initial value $\vartheta_{op}$ for the above-described integration. In other words, the last network-valid value is frozen.

The routine ensures that the value used to determine the load angle $\vartheta_{fail}$ in the event of a power fault corresponds to the load angle $\vartheta_{op}$ of the operation without a power fault prior to the occurrence of the power fault.

Thus, no artifacts caused by a power fault are included in the determination of the load angle $\vartheta_{op}$.

As already explained above, the load angle difference $\Delta\vartheta$ is then determined.

The load angle difference $\Delta\vartheta$ is, for example, determined such that an integral from the motor frequency (=generator frequency) is formed from a rotary speed measurement of the generator. For this purpose, the rotary speed development after the power fault is recorded based on a starting speed. Due to the acceleration of the generator, its speed increases. This is shown in the diagram of FIG. 4 together with the resulting values of the load angle difference $\Delta\vartheta$.

Finally, the load angle on the occurrence of a power fault $\vartheta_{fail}$ is calculated:

$$\vartheta_{fail}=\vartheta_{op}+\Delta\vartheta$$

This gives us the information about the load angle on the occurrence of a power fault. From the load angle on the occurrence of a power fault, $\vartheta_{fail}$, we can then derive a decision as to whether the synchronous generator should remain connected to the power supply network.

The detection of a power fault can, for example, consist of monitoring the generator frequency and interpreting a change in the generator frequency of greater than 0.1 Hz/10 ms as the occurrence of a power fault.

If a change in the generator frequency is less than 0.1 Hz/10 ms and the speed of the power source 7 connected to the synchronous generator 2 is within a predefinable nominal speed +/–e.g. 10 rpm, then the report of a power fault is reset. This can be the case, for example, after the disappearance of a power fault.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for detecting an imminent pole slip of a synchronous generator electrically connected to a power supply network, wherein a signal characteristic of a power fault is detected and an imminent pole slip is determined based on a pre-defined value when a load angle of the synchronous generator increases, comprising the following steps:
- determining a first load angle during operation of the synchronous generator without a power fault,
- determining a synchronous generator frequency as a function of time when a power fault occurs, and
- precalculating a second value of a load angle resulting from the power fault by adding the first value of the load angle to a load angle difference occurring during the power fault, wherein this load angle difference is caused by a deviation of the synchronous generator frequency relative to a power frequency of a power grid, wherein the power fault comprises a power outage of the synchronous generator, wherein, on exceeding a second predefinable value for the second load angle resulting from the power fault, the synchronous generator is disconnected from the power supply network.

2. The method according to claim 1, wherein after detecting a signal characteristic of a power fault, the load angle difference is determined between a polar wheel voltage and a synchronous generator voltage, wherein the load angle difference is caused by a deviation of the synchronous generator frequency relative to the power frequency.

3. The method according to claim 1, wherein the first load angle in the operation without a power fault is determined by measuring a synchronous generator voltage, and a synchronous generator current.

4. The method according to claim 1, wherein, from the calculated second value of the load angle resulting from the power fault, a decision is derived as to whether the synchronous generator should remain connected to the power supply network.

5. The method according to claim 1, wherein, on exceeding a first predefinable value for the second load angle resulting from the power fault, at least one measure is taken to reduce the load angle.

6. A device for determining a load angle of a synchronous generator with a rotor electrically connected to a power supply network, comprising
- at least one measuring device used to determine a frequency of a synchronous generator voltage and/or a synchronous generator current of the synchronous generator,
- at least one rotary speed measuring device for determining a rotary speed,
- and at least one controller designed to perform the following steps:
- determine a first load angle during operation of the synchronous generator without a power fault,
- determine a synchronous generator frequency as a function of time when a power fault occurs, and
- precalculate a second value of a load angle resulting from the power fault by adding the first value of the load angle to a load angle difference occurring during the power fault, wherein this load angle difference is caused by a deviation of the synchronous generator frequency relative to a power frequency of a power grid, wherein the power fault comprises a power outage of the synchronous generator, wherein, on exceeding a second predefinable value for the second load angle resulting from the power fault, the synchronous generator is disconnected from the power supply network.

7. The device according to claim 6, wherein the device further consists of a mechanical power source that is mechanically coupled to the synchronous generator.

8. The device according to claim 7, wherein the mechanical power source is an internal combustion engine, in particular a stationary engine.

9. The device according to claim 7, wherein the mechanical power source is a wind power plant, a hydroelectric power plant or a gas turbine.

10. A controller, configured to:
- determine a first load angle during operation of a synchronous generator without a power fault,
- determine a synchronous generator frequency as a function of time when a power fault occurs, and
- precalculate a second value of a load angle resulting from the power fault by adding the first value of the load angle to a load angle difference occurring during the power fault, wherein this load angle difference is caused by a deviation of the synchronous generator frequency relative to a power frequency of a power grid, wherein the power fault comprises a power outage of the synchronous generator, wherein, on exceeding a second predefinable value for the second load angle resulting from the power fault, the synchronous generator is disconnected from a power supply network.

11. The controller of claim 10, wherein after detecting a signal characteristic of a power fault, the load angle difference is determined between a polar wheel voltage and a synchronous generator voltage, wherein the load angle difference is caused by a deviation of the synchronous generator frequency relative to the power frequency.

12. The controller of claim 10, wherein the first load angle is determined by measuring a synchronous generator voltage and a synchronous generator current.

13. The controller of claim 10, wherein, from the calculated second value of the load angle resulting from the power fault, a decision is derived as to whether the synchronous generator should remain connected to the power supply network.

14. The controller of claim 10, wherein, on exceeding a first predefinable value for the second load angle resulting from the power fault, at least one measure is taken to reduce the first load angle.

* * * * *